US 6,669,871 B2
(12) United States Patent
Kwon et al.

(10) Patent No.: US 6,669,871 B2
(45) Date of Patent: Dec. 30, 2003

(54) ESD DISSIPATIVE CERAMICS

(75) Inventors: Oh-Hun Kwon, Westboro, MA (US); Matthew A. Simpson, Sudbury, MA (US); Roger J. Lin, Framingham, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 50 days.

(21) Appl. No.: 09/988,894

(22) Filed: Nov. 19, 2001

(65) Prior Publication Data

US 2002/0177518 A1 Nov. 28, 2002

Related U.S. Application Data

(60) Provisional application No. 60/252,295, filed on Nov. 21, 2000, and provisional application No. 60/303,655, filed on Jul. 6, 2001.

(51) Int. Cl.[7] .................................................. H01B 1/08
(52) U.S. Cl. ............................. 252/520.21; 252/521.1; 501/103
(58) Field of Search ..................... 252/520.2, 520.21, 252/520.5, 521.1, 519.5; 501/103

(56) References Cited

U.S. PATENT DOCUMENTS

| | | | |
|---|---|---|---|
| 2,528,121 A | 11/1950 | Dickinson | .................... 173/344 |
| 3,410,728 A | 11/1968 | Fullman et al. | |
| 3,502,597 A | 3/1970 | Bush | .......................... 252/518 |

(List continued on next page.)

FOREIGN PATENT DOCUMENTS

| | | | | |
|---|---|---|---|---|
| DE | 3743630 | 3/1989 | ............. | B25B/9/02 |
| JP | 62-025404 A | 8/1994 | | |
| JP | 8-039441 | 2/1996 | | |
| JP | 10-296646 A | 11/1998 | | |
| JP | 3-5363 | 1/1999 | ........... | C04B/35/46 |
| WO | WO 98/49121 | 11/1998 | | |

OTHER PUBLICATIONS

A.J. Wallash, "Electrostatic Discharge (ESD) in Magnetic Recording: Past, Present and Future," Proc. Of Understanding ESD in Magnetic Recording, IDEMA, pp. 3–20, 2000.
A.J. Wallash, T.S. Hughbamks and S.H. Voldman, "ESD Failure Mechanisms of Inductive and Magnitoresistive Recording Heads," EOD/ESD Symposium 95, 322–330 (1995).
J. Elston; Z.Mihailovic, M. Roux, "Study of High–temperature Electrical Properties of Zirconia and Lanthanum Chromite Sinters," Proceedings of a Symposium on Magnetohydrodynamic Electrical Power Generation, p. 1061, 389–403, 1966.
C. Lam, "Characterization of ESD Tweezers for Use with Magnetoresistive Recording Heads," EOS/ESD Symposium–1996, 14–21 (1996).
K.J. Kim et al., "Advancements in Inherently Dissipative Polymer (IDP) Alloys Provide New Levels of Clean, Consistent ESD Protection," EOS/ESD Symposium 2000, pp. 132–138, 2000.

(List continued on next page.)

Primary Examiner—Mark Kopec
(74) Attorney, Agent, or Firm—Toler, Larson & Abel, LLP

(57) ABSTRACT

This invention relates to a dense ceramics having ESD dissipative characteristics, tunable volume and surface resistivities in semi-insulative range ($10^3$–$10^{11}$ Ohm-cm), substantially pore free, high flexural strength, light colors, for desired ESD dissipation characteristics, structural reliability, high vision recognition, low wear and particulate contamination to be used as ESD dissipating tools, fixtures, load bearing elements, work surfaces, containers in manufacturing and assembling electrostatically sensitive microelectronic, electromagnetic, electro-optic components, devices and systems.

70 Claims, 2 Drawing Sheets

U.S. PATENT DOCUMENTS

| | | | | |
|---|---|---|---|---|
| 4,035,191 A | * | 7/1977 | Johns | 106/57 |
| 4,110,260 A | | 8/1978 | Yamamoto et al. | 252/519 |
| 4,316,964 A | | 2/1982 | Lange | 501/105 |
| 4,820,666 A | | 4/1989 | Hirano et al. | |
| 4,931,214 A | | 6/1990 | Worrell et al. | 252/520 |
| 5,175,132 A | * | 12/1992 | Ketcham et al. | 501/103 |
| 5,612,144 A | | 3/1997 | Shinohara et al. | 428/688 |
| 5,800,934 A | * | 9/1998 | Quadri et al. | 428/633 |
| 5,830,819 A | | 11/1998 | Shikata et al. | 501/153 |
| 5,958,813 A | | 9/1999 | Aida et al. | 501/98.4 |
| 6,039,221 A | * | 3/2000 | Chatterjee et al. | 222/361 |
| 6,069,103 A | | 5/2000 | Kwon | |
| 6,136,232 A | | 10/2000 | Burlingame | 252/521.1 |
| 6,232,004 B1 | * | 5/2001 | Lasater | 428/702 |
| 6,258,233 B1 | * | 7/2001 | Sugiyama et al. | 204/424 |
| 6,274,524 B1 | | 8/2001 | Shinji et al. | |
| 6,379,529 B1 | * | 4/2002 | Wahl et al. | 205/780.5 |

OTHER PUBLICATIONS

R.V. Wilhelm, D.S. Howarth, "Iron Oxide–doped Yttria–Stabilized Zirconia Ceramic: Iron Solubility and Electrical Conductivity," Am. Ceram. Soc. Bull., 58 (2) 228–32 (1979).

N.A. Pratten, "Review, The Precise Measurement of the Density of Small Samples," J. Mater. Sci., 16, 1737–47 (1981).

ASTM: D257–93, "Standard Test Methods for DC Resistance or Conductance of Insulating Materials", pp. 108–124.

FED. Test Method Std. No. 101, "Electrostatic Properties of Materials," Rev. B, Method 4046, Jan. 1969; Rev. C, Method 4046.1, Oct. 1982, Change Notice 1.

N. Jonassen, "Static–Electric Characterization of Semi–insulating Materials," EOS/ESD Symposium EOS–6, pp. 45–49, 1984.

G. Baumgartner, "Electrostatic Decay Measurement, Theory and Applications," EOS/ESD Symposium 95, pp. 262–272, 1995.

C.F. Lam, C. Chang, "Decay–Time Characterization of ESD Materials for Use with Magnetoresistive Recording Heads," EOS/ESD Symposium 97, pp. 373–381, 1997.

M.J. DeBarr, et al., "Conduction Mechanism in the La(Al, Mn)$_3$ System," Point Defects and Related Properties of Ceramics, Ed. T.O. Mason, et al, Ceramic Trans. Vol 24, Am. Ceram. Soc., pp. 229–238, 1991.

M.S. Islam, M.Cherry and L.J.Winch, "Defect Chemistry of LaBO$_3$ (B=La, Mn or Co) Perovskite–type Oxides," J. Chem. Soc., Faraday Trans, 92930 479–482 (1996).

* cited by examiner

ESD DISSIPATIVE CERAMICS

PRIORITY CLAIM

This application claims domestic priority from two commonly owned copending U.S. Provisional Patent Applications, namely U.S. Ser. No. 60/252,295, filed Nov. 21, 2000 and U.S. Ser. No. 60/303,655, filed Jul. 6, 2001. The disclosures of these two applications are hereby incorporated herein by reference.

BACKGROUND OF THE INVENTION

An extensive background on electrostatic discharge (ESD) may be found on the Internet at the website of the ESD Association, 7900 Turin Road, Building 3, Suite 2, Rome, N.Y. 13440-2069. See "www.esda.org" for this information.

A number of ESD dissipating tools and containers have been devised and used to prevent ESD events and protect sensitive microelectronic devices. It is known that the ESD dissipating materials should not be fully insulative or conductive. Rather such materials should be semi-insulative (having a Volume Resistivity or "Rv" ranging from $10^3$–$10^{11}$ Ohm-cm). For example, ESD dissipating materials have been suggested in manufacturing and testing MR/GMR heads and assembling hard disk drives.[1,2] Similarly, ESD dissipating ceramic and carbon loaded polymer tweezers have been used in handling semiconductor parts.

The use of semi-insulative ceramics has been reported for some ESD control applications. In general, semi-insulative ceramics were prepared by mixing conductive or semiconductive ceramics with insulative ceramics, which is a similar manufacturing method to those of ESD dissipative polymers. In the past, some semi-insulative materials were prepared for other applications based on the mixing rule. For example, U.S. Pat. No. 3,410,728 reports that metal oxide doped stabilized zirconia have both ionic and electric conductivities at elevated temperature. $LaCrO_3$ doped stabilized zirconia[3] has also been tried for a high temperature electrical conductor.

Recently, German Patent No. 3743630 C1 (1989)[4] reported that tweezers made out of various ceramics having surface resistances of $10^5$–$10^{10}$ Ohms can be used to hold electrostatically sensitive components to protect against electrostatic discharge. The patent further indicated that partially or fully stabilized, zirconia based ceramics can be used as a base material. However, the patent did not disclose any information about manufacturing process and other physical properties.

Japanese Patent Application No. JP62-25404 A (1987)[5] reported that the resistivity of stabilized zirconia can be controlled in the range of $7 \times 10^2$–$5.5 \times 10^5$ Ohm (the resistance value can not be converted to resistivity without electrode dimensions) at 600° C. by adding 5–50 mol. % of transition metal oxide ($Co_2O_3$) for thermistor elements. Again, the patent did not disclose any information about other physical properties.

Japanese Patent Application No. JP3-5363 A (1991) reported that ceramic tape guides made from a mixture of $TiO_2$ (50–99 wt. %) and $Al_2O_3$ can be heat treated in various atmosphere to volume resistivities of $10^4$–$10^{11}$ Ohm-cm to protect the magnetic tape drive from electrostatic discharge damage. The tape guide is more resistant against wear due to its higher hardness of 700–900 $Kg/mm^2$ compared to conventional tape guides made out of stainless steel.

U.S. Pat. No. 5,612,144 (1997)[6] reports that alumina and silicon carbide based ceramics having resistivities of $2 \times 10^6$ to $10^{10}$ $Ohm/cm^2$ can be prepared by adding nitrides and carbides of Ti, Zr, Hf, Nb and Ta for electrification removing components.

U.S. Pat. No. 5,830,819 (1998)[7] reported alumina composite ceramics with volume resistivities from $1 \times 10^7$ to $1 \times 10^{13}$ Ohm-cm at 25–75° C. and an absolute value of the temperature coefficient of volume resistivity (TCR) of not larger than 1.8%/° C. can be prepared with additives containing transition metal oxides such as $TiO_2$, $Cr_2O_3$, $Co_3O_4$, $MnO_2$, $NiO$, $Fe_2O_3$, and $V_2O_5$ for antistatic part such as conveyer arm, handling jig, tweezers for holding wafers.

U.S. Pat. No. 5,958,813 (1999)[8] reports that semi-insulating aluminum nitride (AlN) sintered body can be made to the resistivity of $10^4$ to $10^{11}$ by forming an intergranular phase from at least one oxides of Ti, Ce, Ni, Ta, Y, Er and Yb, or from Si to prepare a member for removing static electricity.

Most materials described above are not necessarily structurally reliable for high performance ESD dissipative ceramic tools because of low flexural strength, fracture toughness and residual porosities in their microstructure. PCT Patent Publication No. WO 98/49121 (1998) reports that semiconductive zirconia with good mechanical properties can be prepared using 10 to 40 wt. % oxides of Fe, Co, Ni, and Cr.

Japanese Patent Application No. JP8-39441 (1996) reported that tweezers with volume resistivities of $5 \times 10^7$ to $1 \times 10^9$ Ohm-cm can be used to hold semiconductor parts to avoid ESD problems.

C. Lam (1996)[9] has reported that the ESD dissipative polymers and ceramic tweezers can be used during the manufacturing and handling of MR heads. The test result indicated that tweezers made out of a "doped" zirconia (vendor proprietary) showed the best performance.

Japanese Patent Application No. JP 10-296646 A (1998) reported a high strength, zirconia based composite tweezers with flexural strength of greater than 700 MPa and resistivities of $10^6$–$10^9$ Ohm-cm. Further, the material showed a residual magnetic flux of up to 14 Gauss.

U.S. Pat. No. 6,136,232 (2000) reports that some perovskite type oxides can be mixed with stabilized zirconia to prepare electrostatic dissipative ceramics. The patent also describes that other perovskite type oxides react with zirconia to form zirconates, thus not satisfactory for electrostatic dissipative ceramics. The patent though reports only volume resistivities as a key property.

U.S. Pat. No. 6,274,524 (2001) claims a semiconductive zirconia body formed under oxidative conditions, comprising 60 to 90 weight % of $ZrO_2$ including stabilizing agent, said zirconia body having no more than 2% by weight $Al_2O_3$, containing greater than 10 weight % to 40 weight % of one kind or more of oxides of Fe, Co, Ni, and Cr as conductivity giving agents, having a three-point flexural strength of at least 580 MPa, and having a volume specific resistance of $10^6$ to $10^9$ Ohm-cm.

The above prior art attempts at control of ESD have not been fully successful in satisfying either current ESD dissipative requirements or the predicted future requirements for ESD dissipative ceramics, for the following reasons:

1. The Prior Art Lacks Sufficient High Density

ESD dissipative ceramic compositions of the prior art to date have not had sufficiently high density (i.e., 97–99% T.D.). This is due to processing techniques used in the prior art, which have not included hot isostatic pressing (hereinafter "HIPing"). The prior art has typically not made hot isostatically pressed (hereinafter "HIPed") materials due to thermochemical instabilities which during a typical HIPing process. The conductivity modifiers employed in the prior art ESD dissipative ceramics often undergo a thermochemical reduction during a HIPing at high temperature (1200°–1500° C.) and high argon pressure (100–250 MPa) in a HIP using graphite heating elements. The thermochemical reaction during the HIPing reduces transitional metallic oxides to oxygen deficient metallic oxides by releasing gases ($CO_2$ or $O_2$) from the body to the surface resulting in bloating and cracking of ceramic bodies.

Pressureless sintered ESD dissipative ceramics have a number of pores (pits) on the surfaces and inside of bodies. For instance, sintered ceramics with 99% TD may have a number of pores of 0.1–10 μm diameters. Assuming a square sintered plate with dimensions of 1 cm×1 cm×0.25 cm, 99% T.D., and monosized pores of 1 μm diameter the number of exposed pores on the surface are 10 millions. Often these pores trap particulate debris and contaminants inside, thus difficult to clean and act as the source of contamination during the use of such components in clean room environments. Further, the cleaning of ceramics with residual pores is difficult compared to that of substantially pore free ceramics by HIPing. On the other hand, the number of pores on HIPed ceramic plate with the same dimension and 99.9% T.D. would be 1 million reducing the number of defect (residual pores) to 1/10 of the sintered plates.

In addition, the residual pores may interact with diamond grits of grinding wheels during the machining into final shapes and dimensions resulting in damaged spots, which is a potential source of particulate debris over the life time of such components.

It is, therefore, highly desirable to prepare a ceramic composition which is easy to densify by a conventional hot isostatic press (HIP) to achieve fully dense, structurally reliable ceramic components.

2. The Prior Art Lacks Sufficient High Strength

The HIPing also further eliminates strength limiting cavities and pores in ceramic bodies resulting in structurally stronger and more reliable components. It is well known that the flexural strength of ceramic components can be improved after HIPing by greater than 20% up to over 50%. Accordingly, HIPing is a preferred processing step to prepare high strength, mechanically reliable components and enable a thinner cross section and complicated shapes.

In summary, HIPable ESD dissipative ceramics are advantageous for an improved contamination control in the fab due to the absence of residual pores.

3. The Prior Art Lacks Choices of Color

Modern manufacturing techniques involve a number of automated processing steps. The efficiency of vision system in such an automated manufacturing system is critical. The high productivity of vision system can be achieved by a fast optical recognition from differences in colors and contrast. The color of magnetic recording heads is substantially black due to the color of slider material (AlTiC, a composite of titanium carbide and alumina). Therefore, a "non-black" ESD dissipative material is highly preferred in order to ensure higher productivity in vision systems. The color of other microelectronic components may vary. Therefor it is desirable to have various color capabilities with ESD dissipative ceramic tools and fixtures. Most prior art ESD dissipative ceramics commercialized to date have been either black or substantially dark.

4. The Prior Art Lacks Tunability

The proper ESD dissipation for a specific application can be obtained by a material with a specific volume/surface resistivity. However, there exist a number of different applications requiring a broad range of surface resistivities as reported. In the prior art, the control of volume and surface resistivities has been obtained mainly by a compositional variation in ESD dissipation. Therefore, one should prepare various compositions of materials to satisfy various application needs, each of which may require different resistivities. In addition, the amount of resistivity modifier used in forming composites often tends to make appreciable changes in other material properties. The design engineer thus tends to modify the resistivity specification for the application based on test results. Accordingly, there is a need for a material having a tunable resistivity.

5. The Prior Art Lacks Sufficient Nonmagnetic Properties

For some applications, especially in GMR head manufacturing, it is desirable to have the lowest magnetic susceptibility of the ESD dissipative material. For other applications to measure electromagnetic performance of microelectronic devices requires no interference from fixtures. Most transition metal based resistivity modifiers exhibit a substantial magnetic susceptibility. It is reported in PCT Publication No. WO 98/49121 that a residual magnetic flux density of up to 16 Gauss is satisfactory for general ESD dissipative applications. However, there is a need for a substantially nonmagnetic material to be used in tools for electromagnetic measurements. Accordingly, for some applications, it is preferable to have an ESD dissipative material made with one or more substantially nonmagnetic resistivity modifiers.

The surface resistivity is not the only measure to determine the performance of ESD dissipative materials. In general, it is very desirable to have a fast dissipation of static charges from the contact at the surface. A more precise measure is a charge decay time in ms as described in the literature.

PCT Publication No. WO 98/49121 reports that an acceptable decay time from 1000 to 100 V is 0.1–20 seconds. Further, they reported that materials outside of that range are not suitable for ESD dissipative ceramics. However, it has been noted that a decay time of less than 0.1 second is preferred for most ESD dissipative applications.[10]

SUMMARY OF THE INVENTION

Figure 1:
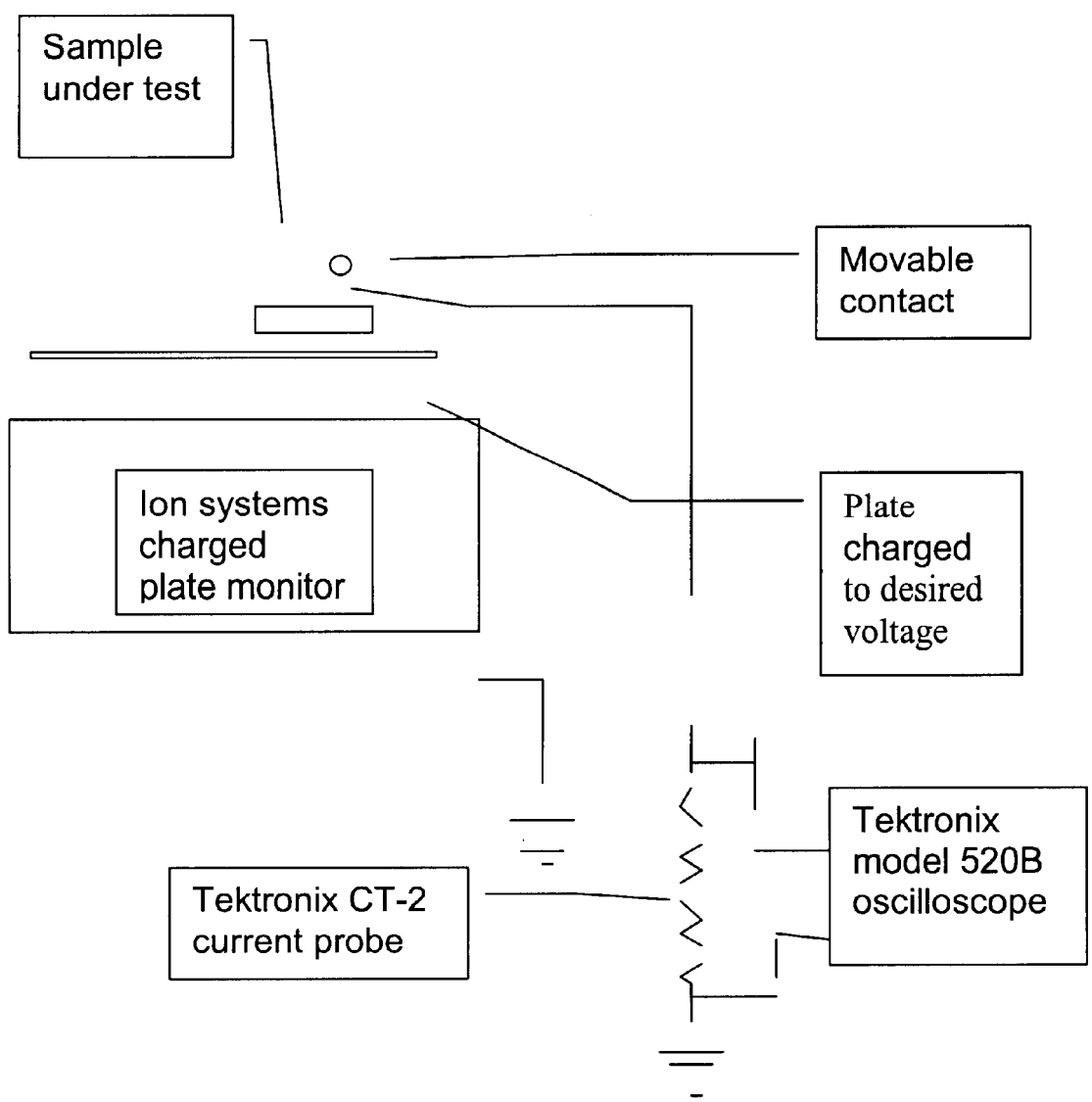
FIG. 1 illustrates the apparatus employed in the examples to take measurements of transient current of sample materials.

One object of the present invention to provide ESD dissipative ceramics which are multifunctional, and capable of dissipating static electricity in contact during manufacturing of sensitive microelectronic devices, and uses. It is known that such ESD dissipative materials must have intermediate resistivities. For instance, the surface resistivity should range from $10^3$ to $10^{11}$ Ohm-cm, preferably from $10^4$ to $10^{10}$ Ohm-cm, more preferably from $10^5$ to $10^9$ Ohm-cm and most preferably from $10^6$ to $10^9$ Ohm-cm. These values are desirable in order to dissipate electrostatic charges. The second requirement is the dissipation characteristics. For instance, the charges must be dissipated fast enough through the volume of part. In addition, the material must be sufficiently homogeneous to dissipate the charges evenly to avoid hot spots.

Another object of present invention is to provide a tunable resistivity in a material to meet various resistivity needs for a number of applications.

A further object of this invention is to provide various colored ESD dissipative ceramics, especially with substantially light colored ceramics.

A still another object of this invention is to provide HIP-able ESD dissipative ceramics with substantially lower residual porosity compared to the pressureless sintered ceramics for high mechanical reliability, low contamination, and good machinability.

A special object of the current invention is to provide substantially non-magnetic ESD dissipative ceramics for safer uses for various applications of electromagnetic measurements.

Accordingly, the present invention is directed to high-density ceramics (i.e., greater than 99% of theoretical density or "TD") suitable for ESD-dissipation applications. In more preferred embodiments, the density of the ceramics is greater than 99.5% of the theoretical density. Such ceramics have a volume resistivity in the range of $10^5$–$10^{10}$ ohm-cm, and also have high strength (i.e., greater than 500 MPa). These ceramics are formed by sintering in air and then, if necessary or desired, by hot isostatic pressing ("HIP" or "HIPing") wherein the HIP environment is preferably not oxidizing. A second heat treatment (either sintering and/or HIPing) is designed to produce one of the following results:

(1) it may raise the resistance; or
(2) it may lower the resistance;

such that the volume resistivity shifts (or moves higher or lower) into the range $10^6$–$10^9$ ohm-cm.

In certain preferred embodiments, the ceramics are prepared from stabilized $ZrO_2$, advantageously with one or more conductive or semi-conductive additives selected from the group consisting of metal oxides, metal carbides, metal nitrides, or combinations thereof. Advantageously, component parts made using these ceramics have a decay time of less than 2 sec.

In certain preferred embodiments, the ceramics have a hardness greater than 8.5 GPa Vickers; with Klc greater than 4 MPa $m^{-\frac{1}{2}}$ and contain ZnO, preferably in range 15–25% (vol % of initial reagents) thereby forming a "light" color ceramic. Some preferred embodiments contain ZnO and up to about 10% (vol.) of a transition metal oxide. For example, manganese oxide (1–8 vol %) works well to produce a "dark" colored ceramic.

Some preferred embodiments contain $SnO_2$, preferably in range 20–80% (vol % of initial reagents). Other preferred embodiments contain ZrC or barium hexaferrite in the range 15–35 vol %.

In certain preferred embodiments, the ceramics have an MOR retention of more than 50% after heat treatment in water at 200–250° C. under equilibrium partial pressure.

According to another preferred embodiment, there is provided a particulate composite based on Y-TZP product 15–40% ZnO or 15–60% doped-$SnO_2$ for light colored ESD dissipating ceramics. The terms "light colored" means that the ceramic material is not black or another dark color. Preferred light colored materials are white, off-white, light grey, tan, and the like.

Unlike most electrically conductive metals, ceramics exhibit a wide range of electrical conductivities and resistivities. Ceramics are insulative, semiconductive and conductive in its bulk properties. The electrical resistivity can be tailored by doping conductive or semiconductive phases in insulative phases. Accordingly, resistivity modifiers have been widely used to tailor conduction properties of materials. There exist a number of well-known conductive ceramic families for such tailorability. The modifier could be reactive or non-reactive with base materials.

Although there is no single ceramic material that completely satisfies the long wish list of properties for ESD dissipation, it is known that zirconia ceramics can satisfy a good number of requirements excluding electrical properties. A number of insulative Y-TZP (yttria partially stabilized tetragonal zirconia polycrystals) parts have been accepted and used for various tools to manufacture magnetic recording heads to date due to its reliable mechanical properties. Other TZPs by other known stabilizers such as rare earth oxides, MgO, CaO, and mixtures thereof can be used as a matrix material.

Zirconia is insulative (Rv=$10^{13}$ Ohm-cm) at room temperature. It has been well known that a conductive zirconia composite can be made by dispersing conductive particles to form electrodischarge machinable (or EDMable) compositions. Typically, particulate dispersoids of metallic conductivity are known to be very effective, such as carbides, borides, and suicides resulting in typical resistivities of less than 1 Ohm-cm, which is too low resistivities for optimum ESD dissipation.

Conductive oxides have also been tried to optimize the electrical resistivity of zirconia, such as transition metal oxides, $Fe_2O_3$, $Co_2O_3$, NiO, $Cr_2O_3$, etc. It has been reported[11] that 3–15 mol. % iron oxide can be doped to yttria-stabilized ceramics to provide an electrical resistivity of ~$10^5$ Ohm-cm at 250° C. See also Kyocera's Japanese Patent Applications, cited above. However, some oxide additives alter the transformability of Y-TZP, deteriorating the fracture toughness. Transition metal oxides act as colorant in zirconia, forming characteristic dark colors. Thus, these additives are not satisfactory for a white/light colored material.

In addition, these transition metal oxides are subjective to thermochemical redox reactions during the high temperature process such as sintering and HIPing. For instance, $Fe_2O_3$ in zirconia undergoes a thermochemical reduction during HIPing in inert gas, such as Ar, resulting in the formation of pores or cracking from gas forming reaction. HIPing in oxygen bearing gases prohibits such deleterious reactions but it is not cost effective due to high cost of platinum heating element and special kiln furniture.

Both conductive and semiconductive phases can be used as resistivity modifier to tailor the resistivity and dissipation characteristics. Some resistivity modifier can react with Y-TZP to form new phases resulting in insulative properties and/or changing the transformability of Y-TZP. Such modifiers must be avoided. In addition, the resistivity modifier should satisfy an many requirements as possible listed below to be successfully used in various applications:

Pressureless sinterability and sinter-HIPability, good machinability, and structural reliability Various colors, preferably a light color Lowest particle generation Tunable ESD properties Lowest corrosion in processing environments, Substantially non-magnetic or strongly magnetic.

It has been found that light colored ESD dissipative ceramics can be prepared by dispersing ZnO grains in Y-TZP matrix. Further, doped $SnO_2$ in Y-TZP is also effective to achieve a light colored material with the desired resistivity.

A few dark colored (or black) ESD dissipative ceramics have also prepared by adding $LaMnO_3$, $LaCrO_3$, ZrC and $BaFe_{12}O_{19}$ in Y-TZP.

Magnetic susceptibilities of resistivity modifiers may vary. (The magnetic susceptibility is defined as the ratio of the intensity of magnetism induced in a material to the magnetizing force or intensity to field to which is subjected.) ZnO, $SnO_2$, $ZrO_2$, $Y_2O_3$, $Al_2O_3$, ZrC and SiC have very low molar magnetic susceptibility of less than $10^{-4}$ ml/mol. On the other hand, $Fe_2O_3$ and $BaFe_{12}O_{19}$ exhibit high molar magnetic susceptibility of greater than $10^{-2}$ ml/mol. Some materials such as $LaMnO_3$ and $LaCrO_3$ show medium molar magnetic susceptibility. The modifiers with low magnetic susceptibility is good for applications requiring low electromagnetic interference. On the other hand, modifiers with high magnetic susceptibilities can be used in applications requiring magnetic functions.

It has been found that the resistivity of some materials significantly change after HIPing. Further, the resistivities of HIPed ceramics can be controlled to a desired values by a controlled heat treatment in air or controlled atmosphere.

Finally, the volume percentages (Vol %) of ingredients disclosed herein are based upon currently available commercial grades of materials. These numbers may be varied if other materials are employed—e.g., nano-size particles would result in lower Vol % values.

DETAILED DESCRIPTION OF THE PREFERRED EMBODIMENTS

As described above, the present invention seeks to solve the problems noted above in the prior art ESD dissipative materials. Accordingly, the present invention provides a strong ESD dissipative material, having high density, preferably formed by HIPing, and a choice of colors, particularly lighter colors than black. The ESD dissipative material of the present invention further has "tunable" resistivities, namely selectable during preparation, with mechanical reliability of components, low contaminating surface, and low magnetic susceptibility.

Preferably, the ceramic compositions of the present invention have ESD dissipative characteristics, tunable volume and surface resistivities in the semi-insulative range.

Preferably, the ceramic compositions of the present invention may also include a small amount (e.g., less than about 2 wt. %) of one or more sintering aids or additives selected from the group consisting of CaO, MgO, SrO, BaO, $Al_2O_3$, $Fe_2O_3$, NiO, CuO, $SiO_2$, $TiO_2$, $Na_2O$, $K_2O$, $CeO_2$, $Y_2O_3$ and mixtures thereof. The amount of additives must be small enough not to alter desirable properties for ESD dissipative ceramics. In some cases, limited amounts of these oxides may be incorporated from raw materials and/or contamination during the powder processing.

Preferably, the ceramic compositions of the present invention are substantially pore free, particularly in relative numbers, e.g., more than 90% pore free—based upon pore sizes greater than 0.5 μm. As used herein, the terms "pore free" and "substantially pore free" may also be defined as a relative density greater than 99%, most preferably greater than 99.5%.

Preferably, the ceramic compositions of the present invention have high flexural strength. Sinter-HIPed TZP materials with ZnO, $SnO_2$, $LaMnO_3$, and $LaCrO_3$ are stronger 1,000, 650, 716, and 1,005 MPa, respectively.

Preferably, the ceramic compositions of the present invention have a color lighter than black. As used herein, the preferred "light" color is defined as being lighter than the midpoint of 16 grey scale as defined by ISO. Color can also be measured using a color meter for more quantitative measurements. The ceramic compositions containing ZnO and $SnO_2$ compositions show light colors, while most others are black or very dark.

Preferably, the ceramic compositions of the present invention have a voltage decay time (a measure of the performance of ESD dissipative ceramics) of less than 500 ms, most preferably less than 100 ms.

Preferably, the ceramic compositions of the present invention have a low transient current, such as less than 100 mA, most preferably less than 50 mA.

As described above, one aspect of the present invention is the formation of ESD dissipating tools using the ceramic compositions of the present invention.

The dense product of the present invention comprises TZP as a base component and particulate dispersoids which include at least one selected from conductive or semiconductive oxides, carbides, nitrides, oxycarbides, oxynitride, oxycarbonitrides, and the like. Some resistivity modifiers were doped with additives or pre-alloyed to desired crystalline form and/or resistivities. When the amount of resistivity modifier is greater than greater than 60 vol. %, it is difficult to take advantage of high fracture toughness and flexural strength of TZP. When the amount of conductivity modifier is less than 10 vol. %, it is difficult to achieve the desired dissipating properties. Suitable ranges of resistivity modifiers thus include 15–50, 20–40 and 25–30 vol. % and include ranges that overlap these values.

The average particle sizes of all ceramic powders were smaller than 1 μm to achieve a homogeneous microstructure and uniform electrical properties and desired dissipation characteristics. Some pre-alloyed powders were milled in a plastic jar with Y-TZP milling media to obtain desired particle size. Powders were mixed by a wet milling in a plastic jar mill with Y-TZP milling media, followed by drying and granulation.

The dense product of the invention is prepared by molding a mixture of Y-TZP powder and conductivity modifier powders into any desired shapes by any molding methods such as dry pressing, slip casting, tape casting, injection molding, extrusion, and gel casting. An organic binder system may be added into the powder mixture to achieve a high green strength for handling, green machining, and to maintain shapes during the densification.

The molded ceramics articles are debinderized and sintered in air or desired reactive or inert atmosphere to greater than 95% T.D., preferably to greater than 97% T.D. The sintered ceramics articles can be further densified by hot isostatic pressing in inert gas or oxygen bearing inert gas to full density. The thus obtained sintered or sinter-HIPed ceramic articles exhibits a volume resistivity of from $1 \times 10^3$ to $1 \times 10^{12}$ Ohm-cm in ambient temperature resistivities between that of an insulator and that of a semi-conductor.

Some resistivity modifiers may react with Y-TZP during sintering and/or HIPing often forming zirconate compounds with very different electrical properties. Such reaction could be much faster at high temperature as these reactions are thermally activated. Thus, it is sometimes very desirable to limit such a deleterious reaction by reducing the densification temperature and times. Another complicating reaction during sintering is that the conductivity modifier could influence the transformability of zirconia grains either stabilizing the Y-TZP grains further or destabilize the Y-TZP grains. In this case, the yttria content in zirconia may be controlled to optimize the transformability or other TZP systems with different stabilizers may be used. The degree of reactions during the sintering significantly vary depending on the particle size, particle size distribution, and densification temperatures. X-ray diffraction was used to determine any detectable chemical reactions during the sintering.

HIPing of zirconia is a well established method for eliminating strength limiting pores or cavities. The flexural strength of sintered ceramics are often improved up to 50% compared to that of pressureless sintered ceramics resulting in a major gain in their structural reliability and machinability. Other resistivity modifiers may have a limited reaction with Y-TZP. However, the modifiers may be thermochemically reduced during the typical HIPing in inert gas, e.g., argon or the like, using graphite heating elements. It is well known that such HIPing may thermochemically reduce such compounds releasing gaseous products. Such gas forming reactions limit the densification caused by bloating, swelling, and/or cracking. For instance, most transition oxides, such as $Fe_2O_3$, $Co_2O_3$, NiO, and $TiO_2$, suffer from such reactions. Accordingly, it is very desirable to find a thermochemically stable, conductivity modifier to avoid such problems. Alternatively, an oxygen HIPing may be used to avoid such negative reactions. However, the high cost of oxygen HIPing is often undesirable for the manufacture of cost effective products.

A number of different ESD dissipation applications require various resistivities ranging from $10^3$ to $10^{11}$ Ohm-cm. The conductivity of ceramics can be controlled by adjusting the amount of conductivity modifiers and/or using different ratios of particle sizes of conductivity modifier over base material. Accordingly, various ceramic compositions may be prepared to cover a variable range of conductivities. Therefore, it is very desirable to establish a method to tune (or tailor) the resistivity of a composition by a rather simple heat treatment (or annealing) of ceramics in air or gas atmosphere. In most ceramic systems the resistivity can change depending on the density of charge carriers such as interstitial cations or vacancies.

It is known that a different heat treatment of ceramics at high temperature in a known atmosphere from their thermal history (densification temperature and atmosphere) can change the equilibrium density of charge carriers in ceramic bodies resulting in a different resistivity. The degree of change in a given system has not been studied for most ceramic systems. In addition, various minor impurities in the system may significantly influence such changes. Further, there may be a few different charge carriers active in some ceramic systems. Accordingly, it is very important to establish the control of resistivities by experiments.

Most ESD dissipative ceramics tools require machining into precision shapes and dimensions. Therefore, if there is a compositional gradient on the surface of ceramic body the ESD dissipating characteristics may vary.

It was found that the volume and surface resistivity fall within an order of magnitude from a sample. Further, the voltage decay time correlates rather well with the surface resistivity in homogeneous material. For instance, a sample with a low surface resistivity (e.g., Rs=$10^6$ Ohm/sq.) exhibits a short voltage decay time, i.e., ~50 ms. If there is a macroscopic compositional segregation in the composite, the dissipation behaviors of material may vary depending on the compositional fluctuation.

Characterization Methods:

Densities of ceramics were measured by the water displacement method with temperature and atmospheric pressure corrections.[12]

Microstructure of ceramics were observed by optical and scanning electron microscopes on polished cross-section of samples prepared by a standard polishing procedure.

Color of ceramic pieces were measured by Miniscan XE Plus available from Hunter Associates Laboratory, Inc., Reston, Va., using 45°/0° optical geometry and 7.6 mm aperture.

X-ray diffraction (XRD) method was used to determine crystalline phases of powders and densified ceramics.

Young's modulus, shear modulus and Poisson's ratio of ceramics were measured by a pulse-echo method using ultrasonic transducers.

Hardness of ceramics were determined by Vickers hardness method at loadings of 5 to 20 Kgf.

The 4-point flexure strength of ceramics were determined by a method specified in ASTM C1160-90 using 3×4×50 mm type-B specimen. Assuming a Weibull modulus of about 10, it is estimated that this method reports a flexural strength that is about 20% lower than that found using JIS R 1601-81 (3-point flexure test using 30 mm span). Average strength of 5 to 15 bars were reported.

Fracture toughness of ceramics were determined by an indentation crack length method using Vickers indenter at loadings of 10 to 40 Kgf. An indentation crack strength method was also used in some occasions.

Volume and surface resistivities (DC) were determined according to methods specified by the ASTM[13], and others at 10 or 100 V. The surface of ceramics was ground by a diamond wheel and cleaned in a ultrasonic bath prior to the resistivity measurement. As an electrode, type 1215 silver-loaded conductive rubber sheet about 0.55 mm thick made by Chomerics Inc. of Woburn, Mass., was used.

Voltage decay time is a measure of charge dissipation and is determined by methods described in literature.[14,15,16,17]

Uses of Semi-Insulating, ESD Dissipative Materials:

The following is a partial list of the many possible uses of the ESD dissipative materials of the present invention. These suggested uses include the following:

MR (magnetoresistive) head substrates,
Transfer tools for magnetic head manufacturing (lapping, polishing, cleaning),
Tools, fixtures, and containers for HGA (head gimbal assembly), HSA (head stack assembly), HDD (hard disk drive) assembly,
Tools, fixtures, and containers for wafer handling, processing, cleaning in water, solvents, and with carbon dioxide,
Tools, fixtures, and containers for wire bonding, trimming, cutting,
Pick-and-place nozzles for IC chip handling,
Nozzles for adhesive and solder dispensing,
Wafer handling fixtures, end effectors, vacuum chucks,
IC handling/test fixtures,
Tools, fixtures, and containers for ESD sensitive devices, e.g., CMOS, GaAs, SiGe, InP, and MRAM, MEMS
Assembly fixtures for IC's and magnetic heads,
Personal tools: tweezers, screw drivers, scissors, blades,
Parts for robotic fingers,
Tools, fixtures, and containers for electro-optic coating process,
Tools, fixtures, and containers for reticles (photo mask), and the like.

In fabricating the component parts described above (which is a non-exhaustive list) the ESD dissipative materials of the present invention may be employed as the entire component part, or as a portion thereof. For example, ESD dissipative materials may be shaped into the various components by grinding, machining, or the like—in order to have a component part this is entirely formed from an ESD dissipative material. On the other hand, small portions of the component parts may be all that require an ESD dissipative material to be added thereto. In that case, one or more small machined or ground (or otherwise formed) segments of the ESD dissipative materials of the present invention (note—two or more materials may be combined if desired) would be added to the component part (either permanently or in a replaceable manner) in the critical area requiring ESD protection. Persons having ordinary skill in each respective component art can readily adapt the ESD dissipative materials of the present invention to the specific requirements of each component listed herein, as well as others not recited above.

The present invention will be further illustrated with reference to the following examples which aid in the understanding of the present invention, but which are not to be construed as limitations thereof.

EXAMPLE 1

ZnO

A Y-TZP powder containing about 2.8 mol % yttria (YZ110) available from Saint-Gobain Ceramics & Plastics (SGC&P) was mixed in water with varying amounts of zinc oxide available from Zinc Corporation of America in a jar mill with Y-TZP milling media. The surface areas of YZ110 and ZnO powders were 7 and 20 $m^2/g$, respectively, prior to milling. The milled powder was granulated by a laboratory method to pressable powder. The powder was uniaxially pressed into steel molds at 40 MPa, and then cold isostatically pressed (or "CIPed") at 207 MPa to form green bodies.

The green bodies were sintered at 2° C./min to a desired sintering temperature (1350°–1500° C.) for 1 hr to achieve a sintered density of greater than 97% TD (theoretical density). The theoretical density was calculated by a mixing rule based on volume % of ingredients assuming no reaction between two phases during the sintering. Some sintered bodies were HIPed in Ar at 1300° C. for 45 min to achieve the full density. All samples were HIPed to greater than 99.5% T.D., mostly greater than 99.8% T.D.

The resulting densified bodies by sintering and sinter-HIPing were measured for density, Young's modulus, hardness, strength, fracture toughness, phase microstructure, volume and surface resistivities, and ESD dissipation (voltage decay) as summarized in Tables 5 and 6.

Effect of ZnO Content and Grain Size:

Table 5 summarizes volume resistivities as a function of vol. % ZnO in Y-TZP of pressureless sintered samples. It is noted that the resistivities for the ESD dissipation ($10^3 < Rv < 10^{12}$ Ohm-cm) can be achieved by composite materials with 15–35 vol. % ZnO and 85–65 vol. % Y-TZP. These sintered materials can be prepared to greater than 99% T.D. at 1400°–1450° C. for 1–2 Hr. in air.

Sample No. 16 was prepared with a Y-TZP powder containing 3 mol % yttria (HSY3.0) and sintered at 1250° C., which is 150° C. lower temperature than others, to minimize the grain growth of ZnO. It is noted that the volume resistivity of this sample is 5 orders of magnitude lower than Sample No. 2. The present result indicates the fine grain size of conductive phase (ZnO) by low temperature sintering is favorable to achieve a lower resistivity. Further, it is believed that the amount of modifier could be lower by low temperature sintering and reduced grain growth to achieve the same ESD dissipative resistivity.

Effect of Annealing Temperature and Atmosphere:

Surprisingly, the resistivity of Sample No. 8 after HIPing at 1350° C./207 MPa for 45 min showed a significant reduction from $7 \times 10^{11}$ to $5 \times 10^3$ Ohm-cm. Samples No. 9–14 show the effect of heat treatment (annealing) in air on the resistivity of HIPed 20 vol. % ZnO/YZ110 composites showing the tunability of resistivity by a simple heat treatment. These results further indicate that it is not necessary to prepare various compositions to cover a broad range of resistivities for various ESD dissipative applications. Annealing at different atmospheres (Sample No. 15) also provide additional means to achieve the tunable resistivity with this composition.

An over-annealed sample with Rv of $5 \times 10^{11}$ Ohm-cm was annealed at 890° C. for 5 Hr. in 2% $H_2/N_2$ atmosphere, resulting in a resistivity of $5 \times 10^6$ Ohm-cm. This result indicates that the resistivity control of this material is reversible. Accordingly, it is believed that the desired resistivity can be achieved by composition, annealing in air, and/or annealing in a controlled atmosphere.

TABLE 5

| ID # | Zirconia type | ZnO (Vol %) | Densification (Method/Temp.) | Heat treatment (Temp/time) | (Atm.) | Rv (Ohm-cm) |
|---|---|---|---|---|---|---|
| 1 | YZ110 | 15 | S/1400° C.* | — | — | 2.0E12 |
| 2 | YZ110 | 20 | S/1400° C. | — | — | 7.4E11 |
| 3 | YZ110 | 25 | S/1400° C. | — | — | 5.6E10 |
| 4 | 2.6YTZP | 25 | S/1400° C. | — | — | 7.6E09 |
| 5 | 2.6YTZP | 30 | S/1400° C. | — | — | 9.1E07 |
| 6 | YZ110 | 30 | S/1400° C. | — | — | 7.9E06 |
| 7 | 2.6Y-TZP | 35 | S/1400° C. | — | — | 6.9E04 |
| 8 | YZ110 | 20 | H/1350° C.** | — | — | 5.0E03 |
| 9 | YZ110 | 20 | H/1350° C. | 560° C./5 Hr | Air | 4.0E04 |
| 10 | YZ110 | 20 | H/1350° C. | 585° C./5 Hr | Air | 9.0E04 |
| 11 | YZ110 | 20 | H/1350° C. | 600° C./5 Hr | Air | 1.7E06 |
| 12 | YZ110 | 20 | H/1350° C. | 630° C./5 Hr | Air | 5.0E06 |
| 13 | YZ110 | 20 | H/1350° C. | 680° C./5 Hr | Air | 1.3E11 |
| 14 | YZ110 | 20 | H/1350° C. | 630° C./24 Hr | Air | 2.5E11 |
| 15 | YZ110 | 20 | H/1350° C. | 810° C./2 Hr | 2% H2/N2 | 6.0E06 |
| 16 | HSY3.0 | 20 | S/1250° C. | | | 2.9E06 |

S*: pressureless sintering in air, H**: HIPing in argon

Transient Current and Voltage Decay Time:

Samples of composition 20% and 25% ZnO/YZ110 were prepared and were heat treated in air at temperatures in the range 600°–650° C. to give the resistivity values shown below. Measurements of transient current were made with the apparatus shown in FIG. 1.

To make a measurement, the plate (which is part of the charged plate monitor) is charged to a fixed voltage. This loads the plate with about 7 nC of charge at 350 V. This charge is then dissipated to ground by touching the sample with the movable contact. The peak transient current is determined from the peak voltage seen from the current probe by the oscilloscope, which records voltage every nanosecond.

Decay time is measured by reading the voltage output of the charged plate monitor on a digital oscilloscope as a function of time. The time for the voltage to fall from 900 V to 100 V is measured from the oscilloscope after initial charging to 1,000 V. Instrument electronics set a limit of 25 ms as the shortest measurable decay time. The following results were obtained:

TABLE 6

| Sample | Volume resistivity (Ohm-cm) | Peak current at 400 V (mA) | Peak current at 500 V (mA) | Decay time (ms) |
| --- | --- | --- | --- | --- |
| #18 (20% ZnO) | $7.7 \times 10^5$ | 1.6 | 16 | less than 25 |
| #10 (20% ZnO) | $2.2 \times 10^6$ | less than 1 | 14.7 | less than 25 |
| #11 (20% ZnO) | $1.6 \times 10^8$ | Not measured | 1 | 43 |
| #34 (25% ZnO) | $3.1 \times 10^9$ | less than 1 | 2.0 | Not measured |

Table 7 summarizes properties of 20 vol. % ZnO/YZ110 composition after HIPing. The material is highly dense with a relative density of greater than 99.5% T.D. with a light yellow color (lighter than 50% of 16 gray scale), mechanically strong with a flexural strength of the material of 1 GPa, substantially safe with low transient current, and highly dissipative with a decay time from 1,000V to 100V is typically less than 50 ms. Accordingly, the material should be good for the ESD dissipative ceramics. Further, the residual magnetic flux density of this material is substantially negligible due to the absence of Fe, Co, Ni, and Cr-oxides in the composition.

from SGC&P in a jar mill with Y-TZP milling media. The powder has nominal dopants of 1% $Sb_2O_3$ and 0.5% CuO for improved conductivity. Prior to the mixing the doped tin oxide was milled to surface area of ~15 $m^2$/g. Surface area of Y-TZP was 7 $m^2$/g prior to milling. Another commercial tin oxide powder (available from Alfa Aesar, Ward Hill, Mass.) milled to a surface area of 12 $m^2$/g was also used. The milled powder was granulated by a laboratory method to pressable powder. The powder was uniaxially pressed into steel molds at 40 MPa, and then CIPed at 207 MPa to form green bodies. The green bodies were sintered at 2° C./min to a desired sintering temperature (1400–1500° C.) for 1 hr to achieve a sintered density of greater than ~95% T.D. The theoretical density was calculated by a mixing rule based on the composition assuming no reaction between two phased during the sintering. Some sintered bodies were HIPed in Ar at 1400° C. for 45 min to achieve the full density.

The resulting densified bodies by sintering and sinter-HIPing were measured for density, Young's modulus, hardness, strength, fracture toughness, phase microstructure, volume and surface resistivities, and ESD dissipation (voltage decay).

The pure $SnO_2$ is an insulative material. It was confirmed that compositions of 10–50% $SnO_2$/Y-TZP are insulative, $Rv=10^{13}$ Ohm-cm, as shown in Table 9. A limited heat treatment in Ar and $N_2$ in a tube furnace did not show a significant decrease in the resistivity. The color was remained as light grayish, lighter than 50% of 16 gray scale. A HIPed sample at 1400° C./207 MPa/60 min in Ar turned into a medium gray and showed resistivities of $10^7$ Ohm-cm.

TABLE 9

| | $SnO_2$ (Vol %) | Densification (Method/Temp.) | Rv (Ohm-cm) |
| --- | --- | --- | --- |
| Undoped | 10 | S/1450° C.* | 1.2E13 |
| Undoped | 20 | S/1450° C. | 1.5E13 |
| Undoped | 30 | S/1450° C. | 3.7E13 |
| Undoped | 35 | S/1450° C. | 3.4E13 |
| Doped | 50 | S/1450° C. | 6.5E12 |
| Doped | 50 | H/1350° C.** | 6.1E07 |
| Doped | 50 | H/1300° C.** | 2.6E07 |

S*: pressureless sintering in air, H**: HIPing in argon

TABLE 7

| Property Name | SI Units | (Mean values) | Test method |
| --- | --- | --- | --- |
| Color | | Light yellow- | Visual/color meter |
| Density | g/cm³ | 5.99 | Water displacement |
| Porosity | % | less than 0.5% | Density and polished surface |
| Grain size | μm | 1 | Linear intercept |
| Young's Modulus, 20° C. | GPa | 195 | Ultrasonic wave velocity |
| Hardness - Vickers, 20° C. | GPa | 9.2 | Vickers hardness at P = 20 Kgf |
| Flexural Strength, 20° C. | MPa | 1000 | 4-point bending, ASTM-C1161-90 |
| Fracture Toughness, 20° C. | MPa | 5.9 | Indentation crack length |
| Fracture Toughness, 20° C. | MPa | 4.2 | Indentation strength at P = 40 Kgf |

EXAMPLE 2

$SnO_2$

A Y-TZP powder (HSY3.0) containing about 3 mol % yttria available from Zirconia Sales of America was mixed with varying amount of tin oxide ($SnO_2$, T1186)[18] available Properties of HIPed 50% doped-$SnO_2$/HSY3.0 were measured as summarized below. The material shows light to medium grey. The material is stiffer and harder than those of 20 vol. % ZnO/YZ110 which are similar to those of typical Y-TZP's. In addition, the material is also substantially non-magnetic.

TABLE 10

| Property Name | SI Units | (Mean values) | Test method |
|---|---|---|---|
| Color | | Light gray | Visual/color meter |
| Density | g/cm³ | 6.43 | Water displacement |
| Porosity | % | less than 1% | Density and polished surface |
| Grain size | μm | 1 | Linear intercept |
| Young's Modulus, 20° C. | GPa | 224 | Ultrasonic wave velocity |
| Hardness - Vickers, 20° C. | GPa | 11.4 | Vickers hardness at P = 20 Kgf |
| Flexural Strength, 20° C. | MPa | 650 | 4-point bending, ASTM-C1161-90 |
| Fracture Toughness, 20° C. | MPa m$^{1/2}$ | 3.9 | Indentation crack length |
| Fracture Toughness, 20° C. | MPa m$^{1/2}$ | 3.9 | Indentation strength at P = 40 Kgf |

EXAMPLE 3

LaMnO₃

A batch of $LaMnO_3$ was prepared by the solid-state reaction of an equimolar powder mixture of $La_2O_3$ and $Mn_2O_3$ at 1400° C. for 2 hr in air. The XRD of reaction formed powder indicated a well developed $LaMnO_3$, a perovskite family. The reaction formed powder was milled in a plastic jar mill with Y-TZP milling media to BET surface area of 15 m²/g. A batch of 30 vol % $LaMnO_3$/3Y-TZP was processed using mixtures of $LaMnO_3$ and Y-TZP (YZ110, SGC&P, Worcester, Mass.) followed by the same preparation method described in Example 1.

Samples were sintered at 1250°–1350° C. to greater than 98% T.D. The density of low temperature (1225° C.) sintered samples was greater than 97% T.D. Sintered samples were HIPed at 1175° and 1350° C. at 207 MPa of argon to full density. The high temperature (1350° C.) sinter-HIPed samples show a significant grain growth, formation of reaction phase, lanthanum zirconate ($La_2Zr_2O_7$), and a few minor surface cracks. The low temperature HIPed samples show a much smaller grain size and no indication of bloating or cracking. Both sintered and HIPed samples were black. It is reported in U.S. Pat. No. 6,136,232 (2000) that some perovskite-type compounds such as $LaMnO_3$ and $LaFeO_3$ are not chemically stable in combinations with partially stabilized zirconias and at typical sintering temperatures form secondary zirconia compounds such as $La_2Zr_2O_7$ thus effecting the phase stability of the remaining zirconia alloy. The present result indicates that $LaMnO_3$ can be successfully used to prepare a composite with Y-TZP with a low temperature sintering.

Microstructural observations by SEM from a polished cross section of low temperature sintered sample indicates that the grain size of the material is less than 1 μm. The XRD from a polished cross section also indicated that the majority of tetragonal zirconia was retained with negligible reaction to form lanthanum zirconate ($La_2Zr_2O_7$), which is an insulator. The present results indicate that a tough, black ESD dissipative zirconia can be prepared by mixing $LaMnO_3$ in Y-TZP by a low temperature sintering.

TABLE 11

| ZrO₂ type | LaMnO₃ (Vol %) | Densification (Method/Temp.) | Rv (Ohm-cm) |
|---|---|---|---|
| YZ110 | 20 | S/1250° C.* | 1.2E11 |
| YZ110 | 25 | S/1250° C. | 1.5E08 |
| YZ110 | 30 | S/1250° C. | 3.7E07 |
| YZ110 | 30 | H/1175° C.** | 6.1E07 |
| YZ110 | 30 | H/1200° C.** | 2.6E07 |
| YZ110 | 30 | S/1400° C. | 2.8E11 |
| YZ110 | 30 | H/1350° C.** | 6.4E12 |

S*: pressureless sintering in air, H**: HIPing in argon

TABLE 12

| Property Name | SI Units | (Mean values) | Test method |
|---|---|---|---|
| Color | | Light gray | Visual/color meter |
| Density | g/cm³ | 6.13 | Water displacement |
| Porosity | % | less than 0.5% | Density and polished surface |
| Grain size | μm | 1 | Linear intercept |
| Young's Modulus, 20° C. | GPa | 182 | Ultrasonic wave velocity |
| Hardness - Vickers, 20° C. | GPa | 11.8 | Vickers hardness at P = 20 Kgf |
| Flexural Strength, 20° C. | MPa | 716 | 4-point bending, ASTM-C1161-90 |
| Fracture Toughness, 20° C. | MPa | 4.2 | Indentation crack length |
| Fracture Toughness, 20° C. | MPa | 3.6 | Indentation strength at P = 40 Kgf |

The present result is different from others. For instance, Kyocera's Japanese Patent Application indicates the amount of $Mn_2O_3$ must be limited to less than 2 Wt. % in order to achieve a good zirconia ceramics.

The effect of HIPing on the volume resistivity was also determined. Unlike other materials described in Examples 1 and 2, the volume resistivity of the material was not changed before and after sintering. It is believed that various doped $LaMnO_3$ and $LaBO_3$ (B Al, Mn or Co)[19,20] family can be used as semiconductive dispersoids in zirconia.

EXAMPLE 4

LaCrO₃

A batch of $LaCrO_3$ was prepared by the solid-state reaction of an equimolar powder mixture of $La_2O_3$ and $Cr_2O_3$ at 1400° C. for 4 hr in air. The XRD of reaction formed powder indicated a well developed $LaCrO_3$. The reaction formed powder was milled in a plastic jar mill with Y-TZP milling media to BET surface area of 15 m²/g. A batch of 30 vol % $LaCrO_3$/3Y-TZP was processes using mixtures of $LaMnO_3$ and Y-TZP (HSY-3.0, Zirconia Sales of America, Atlanta, Ga.) followed by the same preparation method described in Example 1. Samples were sintered at 1450°–1500° C. in air to greater than 97% T.D. and showed a dark green color with a volume resistivity of 9×10³ Ohm-cm. Sintered samples were HIPed at 1450° C. at 207 MPa of argon to full density. The color of HIPed samples became slightly lighter than that of sintered only.

Microstructural observations by SEM from a polished cross section indicate that the grain size of the material is about 1 μm. The XRD from a polished cross section also indicated that the majority of tetragonal zirconia was retained with no measurable reaction to form lanthanum zirconate. The present results indicate that a dense, tough, dark colored ESD dissipative zirconia can be prepared by mixing $LaCrO_3$ in Y-TZP by sinter-HIPing.

TABLE 13

| $ZrO_2$ type | $LaCrO_3$ (Vol %) | Densification (Method/Temp.) | Heat treatment (Temp/time) | (Atm.) | Rv (Ohm-cm) |
| --- | --- | --- | --- | --- | --- |
| 3.0Y-TZP | 10 | S/1550° C. | | | 1.0E11 |
| 3.0Y-TZP | 20 | S/1550° C. | | | 3.5E10 |
| 3.0Y-TZP | 30 | S/1550° C. | | | 1.7E07 |
| 3.0Y-TZP | 40 | S/1550° C. | | | 2.0E06 |
| 3.0Y-TZP | 30 | H/1400° C.** | — | — | 1.2E12 |
| 3.0Y-TZP | 30 | H/1400° C.** | 1400 C./1 Hr | Air | 5.4E06 |

S*: pressureless sintering in air, H**: HIPing in argon

TABLE 14

| Property Name | SI Units | (Mean values) | Test method |
| --- | --- | --- | --- |
| Color | | Dark green | Visual/color meter |
| Density | g/cm³ | 6.27 | Water displacement |
| Porosity | % | less than 0.5% | Density and polished surface |
| Grain size | μm | 1 | Linear intercept |
| Young's Modulus, 20° C. | GPa | 228 | Ultrasonic wave velocity |
| Hardness - Vickers, 20° C. | GPa | 12 | Vickers hardness at P = 20 Kgf |
| Flexural Strength, 20° C. | MPa | 1020 | 4-point bending, ASTM-C1161-90 |
| Fracture Toughness, 20° C. | MPa | 4.8 | Indentation strength (3.0Y-TZP) |
| Fracture Toughness, 20° C. | MPa | 5.7 | Indentation strength (2.5Y-TZP) |
| Fracture Toughness, 20° C. | MPa | 8.9 | Indentation strength (2.0Y-TZP) |
| ESD voltage decay time | ms | 70 | From 1000 V |

The resistivities were measured before and after HIPing. Surprisingly, we have found a significant increase, up to 3 orders of magnitude, in resistivity after HIPing. The thermal annealing in air at 1400° C./60 min in air reproducibly recover the resistivity back to the sintered value as summarized in Table 13. The present finding on the reversible resistivity has not been reported in the literature. U.S. Pat. No. 6,136,232 (2000) reports that complex chromate $A_xB_y$-$CrO_3$ can be used to prepare electrostatic dissipative ceramics. Further, it is stated that the material can be HIPed for higher density. However, it was not disclosed that the resistivity of such material drastically changes with HIPing and a need for adjustment of resistivity by the controlled heat treatment.

Batches with varying amounts of Y2O3: 2Y, 2.5Y, and 3Y (mol. %) were prepared using mixtures of HSY3.0 and DK-1 (0% $Y_2O_3$—$ZrO_2$, Zirconia Sales of America) to determine the optimum stabilization of zirconia. The fracture toughness of these compositions are listed in Table 8 showing a higher $K_{IC}$ up to 9 MPam$^{0.5}$ of the composite with 2Y-TZP.

EXAMPLE 5

Zirconium Carbide (ZrC)

Similarly, ZrC can be mixed with Y-TZP to prepare dense, semi-insulative, ESD dissipative ceramics as listed in Table 16. The semi-insulating compositions were prepared by mixing 10 to 20 vol % of ZrC in Y-YZP (HSY3.0). ZrC does not react with $ZrO_2$ during the hot pressing at 1550° C./20 MPa in argon using graphite dies. The color of hot pressed ZrC was black. The resulting composite is stiffer and harder than $ZrO_2$. Accordingly, the semi-insulating materials with ZrC is slightly stiffer and harder than Y-TZP can be prepared with ZrC.

TABLE 15

| ZrC | 3Y-TZP (Vol. %) | Hot Pressing (Temp./Hr) | Rv (Ω-cm) |
| --- | --- | --- | --- |
| 10 | 90 | 1550° C./1 H | 1.3E12 |
| 11.5 | 88.5 | 1550° C./1 H | 7.0E11 |
| 12.5 | 87.5 | 1550° C./1 H | 5.2E11 |
| 13.5 | 86.5 | 1550° C./1 H | 3.7E09 |
| 15 | 85 | 1550° C./1 H | 5.4E04 |
| 20 | 80 | 1550° C./1 H | 3.7E04 |
| 25 | 75 | 1550° C./1 H | 2.3E00 |

EXAMPLE 6

Aluminum Nitride (AlN)

This example shows another ceramic material—aluminum nitride—that can be heat-treated to be suitable for static dissipation. A 12×12×1 mm square of aluminum nitride was procured from SGCP (Carborundum). Surface resistance was measured to be greater than 10¹⁰ ohms. This is too high to be able to dissipate charge effectively. The sample was then heat treated in argon at 1900° C. for 20 minutes and cooled rapidly to room temperature at a rate more than 10° C./minute. The surface resistance was measured again on both sides. It was about 2×10⁹ ohms, which is in the range suitable for dissipating static electricity.

EXAMPLE 7

Complex Oxides—BaO 6Fe₂O₃

Complex oxide compounds such as barium hexaferrite (BaO 6$Fe_2O_3$) can also be mixed with Y-TZP (YZ 110) to prepare dense, semi-insulative, ESD dissipative ceramics.

The semi-insulating compositions were prepared by mixing 25 vol % of BaO 6Fe$_2$O$_3$ (BaFe$_{12}$O$_{19}$) in Y-YZP (YZ110). The composition can be sintered at 1300°–1400° C. for 1 Hr. in air to greater than 98% TD. The volume resistivity of the sintered disks was 2×10$^7$ Ohm-cm. Barium hexaferrite is known as a strong magnetic material. The sintered composite was easily attracted by a permanent magnet indicating a good retainablilty of BaO 6Fe$_2$O$_3$ phase in fine zirconia matrix. In summary, one can also prepare a strong magnetic, ESD dissipative, zirconia ceramics for potential applications.

EXAMPLE 8

Color Measurements

Color measurements were made using two separate methods. First, lightness of color was judged using a 16 level gray scale ranging from white to black. Measurements were also made with a Hunterlab Miniscan XLE calorimeter, made by Hunter Associates Laboratory of Reston, Va. The instrument illuminates the sample target with diffuse illumination and observes the reflected light at an 8 degree angle with a spectrophotometer covering the range 400–700 nm. Output from the colorimeter was presented using the CIE 1976 L*a*b* scale, wherein:

L* measures lightness and varies between 0 and 100 (100 is white/1 is black);

a* measures redness when positive, gray when zero and greenness when negative;

b* measures yellowness when positive, gray when zero and blueness when negative.

We noted that the 50% point on the gray scale corresponded to values of L* higher than 50.

This lowered surface resistance below 1 MΩ, as measured with the same probe. Electrodes were then attached with silver paint to two locations on the ground face of the bar about 7 mm apart along the length of the bar.

The bar with electrodes was loaded into a standard 4-point bending fixture (with supports 40 mm apart on the tension side and 20 mm apart on the compression side) with the electrodes on the compression side.

Load was applied to the bar and the resistance between the electrodes was measured. The dependence of resistance R on compressive strain e was found to follow the equation $\partial 1 \, nR/\partial e = 100$. This value is unusually high—for most conductors $\partial 1 \, nR/\partial e$ is less than 5. Although the present invention is not limited by theory, it is believed that this behavior results from the fact that only just enough conductor has been added to the insulating zirconia ceramic to make it conductive, and that small perturbations to the material therefore have disproportionately large effects on conductivity.

Several applications suggest themselves. Monitoring the resistance of a component made from this class of materials will provide an indication of the stress in the material. For heavily loaded components, this may lead to early detection of incipient failures. Vibrations in the material should produce oscillations in the electrical conductivity and hence may be conveniently detected.

In the example, the sample was deliberately fabricated to have a non-uniform conductivity. This was beneficial because the current was forced to go through the most highly stressed region of the sample, thereby maximizing the response. In other situations—e.g., a bar in pure tension—the stress may be more uniform and, hence, there would be no need to make the conductivity non-uniform.

In the example, grinding the surface of the sample was used to enhance the conductivity of the sample in one local

TABLE 16

CIE Measurement Results

| Sample | Processing | Density (% theoretical) | Resistivity (MΩ-cm) | L* | a* | b* |
| --- | --- | --- | --- | --- | --- | --- |
| A | 1250C/ 1 hr sinter, 1200C/ 45 min HIP | 99.0 | 0.0012 | 75.28 | −6.07 | 10.63 |
| B | 1250C/ 1 hr sinter, 1200C/ 45 min HIP | 99.0 | 0.0014 | 69.06 | −5.1 | 2.53 |
| As above, after 4 hrs/580C in air | | | 10.7 | 86.07 | −4.81 | 15.94 |
| C | 1400C/ 1 hr sinter, 1350C/ 45 min HIP | >99% | 3 | 79.61 | 2.62 | 48.21 |
| Kyocera (comparative) | (As supplied) | unknown | 10 | 44.03 | −0.04 | −0.32 |

The first two samples (A and B) were made from the HSY3.0 zirconia source and sample C from YZ110. The Kyocera sample was a commercially obtained sample.

EXAMPLE 9

Effect of Perturbations on Conductivity

A 50 mm×4 mm×3 mm bar of composition ZrO$_2$-20%ZnO was prepared by mixing powders of ZrO$_2$-2.6%Y$_2$O$_3$ and ZnO, milling them together, sintering and then hot isostatic pressing, as in the earlier examples.

Figure 3:
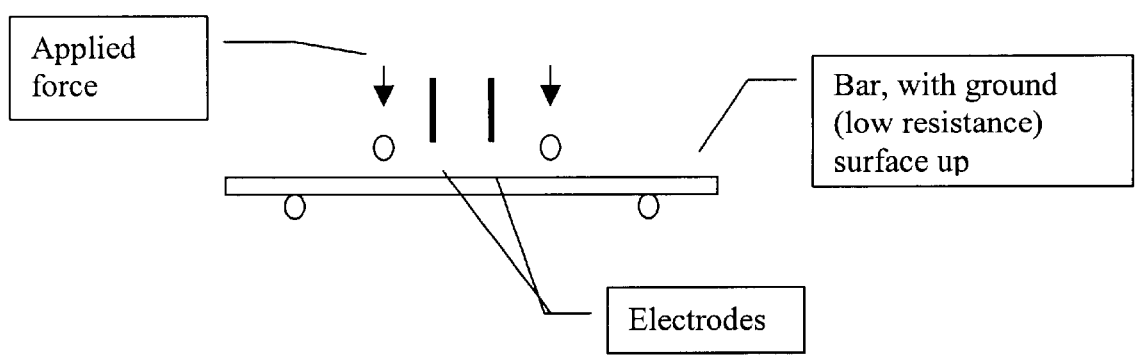
FIG. 3 illustrates the apparatus employed in the examples to measure the effect of perturbations on conductivity of sample materials.

FIG. 3 illustrates the test apparatus used herein. The bar was heat treated in air in the range 600°–700° C. and the surface resistance of the bar, as measured with a PRF-912 probe (from ProStat Corporation of Bensonville, Ill.) was found to be over 100 MΩ. One side of the bar was ground.

area. This could also be accomplished by locally reducing the conductive phase by a chemical means—atomic hydrogen for example—or by diffusing in an additive that promotes conductivity in the conductive phase (alumina in zinc oxide, for example), or by locally lowering the concentration of a conductivity inhibitor (lithium oxide in zinc oxide reduces conductivity and the lithium concentration in a lithium doped sample might be reduced by heat treatment in an HCl atmosphere).

Figure 2:
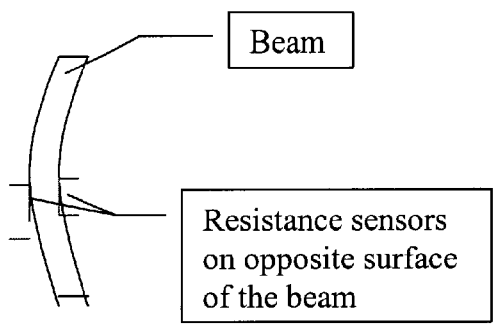
FIG. 2 illustrates the apparatus employed in the examples to measure the resistance of sample materials in two locations—one stressed and one not stressed.

Another factor influencing conductivity is the temperature of the specimen. In cases where this varies, it may be advantageous to measure the resistance of the specimen in two locations—one stressed and one not stressed and use the results from the not-stressed area to correct for the influence of temperature (See FIG. 2). The case of a beam in flexure allows a slightly different approach:

The two resistance sensors are fabricated by locally increasing the conductivity of the material on opposite faces of the beam. If the two resistance sensors are identical, then the ratio of their resistances will be independent of temperature and will be proportional to the bending stress in the beam.

EXAMPLE 10

Low Temperature Degradation (LTD) Resistant ESD Safe Ceramics

Y-TZP has long been known as tougher and stronger than most other ceramics. It's low temperature degradation (LTD) behavior is, though, a significant limitation for some wear resistant applications at low temperature regime (150°–300° C.). The tetragonal zirconia polycrystals (TZP) transform to monoclinic zirconia polycrystals resulting in volume expansion and microcracking at the low temperature regime. Such transformation can be worst in the presence of humidity, especially under equilibrium steam pressure. An accelerated test has been used to determine the LTD behavior of Y-TZPs as described in U.S. Pat. No. 6,069,103, which is hereby incorporated herein by reference.

MOR bars were autoclaved at 200° and 250° C. under equilibrium steam pressure for 48 hours in an autoclave, followed by 4-point bending strength measurement. Table 16 shows flexural strength of 20 vol. % ZnO/YZ110 after the autoclave treatments. The results indicate that the resistance to LTD of 20ZnO/YZ110 is significantly better than that of typical Y-TZP (TZ-3Y, available from Tosoh, Japan). The improved LTD resistance over Y-TZP is desirable using ESD dissipative, zirconia ceramics in degrading environments.

TABLE 17

Flexural strength after autoclave treatment for 48 hours.

| Autoclave temperature (° C.) | Flexural strength (MPa) | |
|---|---|---|
| | 20 ZnO/YZ110 | TZ3Y |
| 20 | 1050 | 1507 |
| 200 | 574 | 474 |
| 250 | 744 | 590 |

EXAMPLE 11

Low Particle Generation

ESD safe ceramics are often used in clean room processing environments of magnetic heads, semiconductor components, and IC manufacturing. If ESD safe ceramics shed particles during their use, sensitive electronic components might be damaged. In addition, those contaminated particles must be cleaned, resulting in a costly down time of expensive processing equipment. Further, contaminated particles may contribute for latent or delayed damage in finished products, contributing to costly warranty repairs. Therefore, it is very desirable to develop a material with drastically reduced particle generation. In addition, an improved surface finish process of such material is highly desirable for low particle generation.

Twenty (20) ZnO/YZ 110 samples of disk and square shapes were tumble finished by rolling in a ten sided mill for 72 hours with quartz or silicon carbide media. Some samples were lapped or polished to smoother surface finish to determine the effect of surface finish on the particle generation. A white light interference microscope, Zygo NewView 100, was used to measure surface roughness (Ra) after this tumble finish treatment.

Samples of the 20 ZnO/YZ 110 with various surface finishes were tested with a liquid particle counter (LPC). A sample with 3×4×25 mm in size (machined MOR bar) and surface finish of 3800 Å was used as a baseline. Samples were cleaned using a standard procedure used to clean burnish/glide heads for magnetic disk media. A Crest ultrasonic bath was used to dislodge particles from the samples into water (68 kHz for 30 sec.). Liquid particle counts were taken from this water using an LS-200 PMS. The results were normalized by surface area of test sample and reported as number of particles per $cm^2$.

The baseline sample with Ra of greater than 3000 Å showed about greater than 600 particles/$cm^2$. The treated samples significantly reduced number of particles as a function of surface finish as shown in Table 18. Rougher surfaces typically generate more particles in sliding friction or physical impact applications due to the abrasive nature of the surface and the material used. Decreasing the surface roughness of 20 ZnO/YZ110 by tumble finish, fine grinding, lapping or polishing reduces its potential for particle generation.

TABLE 18

LPC results as a function of surface finish.

| Surface finish | Ra (Å) | LPC (particles/$cm^2$) |
|---|---|---|
| Baseline | greater than 3000 | greater than 600 |
| Tumble finish | 2250 | 250 |
| Tumble finish | 1500 | 120 |
| Fine grinding | 1000 | 78 |
| Lapping | 500 | 37 |
| Polishing | 20 | 20 |

Tumbling is a low cost, industrial process to clean asperities and burrs. Ceramic thread guides are tumble finished to Ra of 100 Å. The present results indicate that ESD dissipative ceramics can be prepared to very low LPC by HIPing and optimum surface finish. For instance ESD dissipative, ceramic tweezers tips can be tumble finished to low LPC.

REFERENCES

The following references are cited herein as background information. To the extent necessary for a full understanding of this invention, the disclosures of these references are hereby incorporated herein by reference:

1. A. J. Wallash, "Electrostatic Discharge (ESD) in Magnetic Recording: Past, Present and Future," Proc. Of Understanding ESD in Magnetic Recording, IDEMA, pp. 3–20, 2000.
2. A. J. Wallash, T. S. Hughbamks and S. H. Voldman, "ESD Failure Mechanisms of Inductive and Magnitoresistive Recording Heads," EOD/ESD Symposium 95, 322–330 (1995).
3. J. Elston; Z. Mihailovic, M. Roux, "Study of High-temperature Electrical Properties of Zirconia and Lanthanum Chromite Sinters," Proceedings of a Symposium on Magnetohydrodynamic Electrical Power Generation, p. 1061, 389–403, 1966.
4. Popp; V. Wuerttenbe, "Tweezers protecting components against electrostatic discharge—has handling surfaces of non-chafing ceramic of high specific surface resistance" DE 3743630 C, Mar. 16, 1989.

5. "Tape Guides and Method of Manufacturing", JP 3-5363 A, Jan. 11, 1999,—Kyocera.
6. N. Shinohara and O. Kita, "Electrification Removing Components", U.S. Pat. No. 5,612,144 Mar. 18, 1997.
7. K. Shikada, et al., "Alumina Sintered Product", U.S. Pat. No. 5,830,819 Nov. 3, 1998.
8. H. Aida, Y. Ito, T. Fukutome, and K. Mikami, "Semi-insulating Aluminum Nitride Sintered Body", U.S. Pat. No. 5,958,813, Sept. 28, 1999.—Kyocera.
9. C. Lam, "Characterization of ESD Tweezers for Use with Magnetoresistive Recording Heads," EOS/ESD Symposium-1996, 14–21 (1996).
10. K. J. Kim et al., "Advancements in Inherently Dissipative Polymer (IDP) Alloys Provide New Levels of Clean, Consistent ESD Protection," EOS/ESD Symposium 2000, pp. 132–38, 2000.
11. R. V. Wilhelm, D. S. Howarth, "Iron Oxide-doped Yttria-Stabilized Zirconia Ceramic: Iron Solubility and Electrical Conductivity," Am. Ceram. Soc. Bull., 58 (2) 228–32 (1979).
12. N. A. Pratten, "Review, The Precise Measurement of the Density of Small Samples," J. Mater. Sci., 16, 1937–47 (1981).
13. ASTM: D257-93, "Standard Test Method for DC Resistance or Conductance of Insulating Materials".
14. FED. Test Method Std. No. 101, "Electrostatic Properties of Materials," Rev. B, Method 4046, January 1969; Rev. C, Method 4046.1, October 1982, Change Notice 1.
15. N. Jonassen, "Static-Electric Characterization of Semi-insulating Materials," EOS/ESD Symposium EOS-6, 1984.
16. G. Baumgartner, "Electrostatic Decay Measurement, Theory and Applications," EOS/ESD Symposium 95, pp. 265–72, 1995.
17. C.F. Lam, C. Chang, "Decay-Time Characterization of ESD Materials for Use with Magnetoresistive Recording Heads," EOS/ESD Symposium 97, pp. 373–81, 1997.
18. E. A. Bush, U.S. Pat. No. 3,502,597, Mar. 24, 1970.—"Method of Improving the Electrical Conductivity of Sintered Tin Oxide Electrodes".
19. M. J. DeBarr, et al., "Conduction Mechanism in the La(Al,Mn)$_3$ System," Point Defects and Related Properties of Ceramics, Ed. T. O. Mason, et al, Ceramic Trans. Vol 24, Am. Ceram. Soc., pp. 229–238, 1991.
20. M. S. Islam, M. Cherry and L. J. Winch, "Defect Chemistry of LaBO$_3$ (B=La, Mn or Co) Perovskite-type Oxides," J. Chem. Soc., Faraday Trans, 92930 479–482 (1996).

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. An ESD dissipative ceramic component formed by sintering a mixture comprising a base material and one or more resistivity modifiers for a sufficient time and at a sufficient temperature to achieve at least 99 percent of the theoretical density,
   wherein the base material comprises a tetragonal zirconia polycrystal (TZP);
   wherein the resistivity modifier comprises from about 5 vol. % to 60 vol. % of the base material and is selected from the group consisting of conductive and semiconductive materials or mixtures thereof;
   and wherein the ESD dissipative ceramic component has the following physical properties;
      (a) volume resistivity ranging from $10^3$–$10^{11}$ Ohm-cm;
      (b) flexural strength of at least 500 MPa; and
      (c) voltage decay time of less than 500 ms.

2. The ESD dissipative ceramic component of claim 1, wherein the TZP comprises yttria stabilized TZP (Y-TZP) wherein the yttria is present at from about 2.5 to 4.5 mole percent.

3. The ESD dissipative ceramic component of claim 2, wherein the Y-TZP comprises 2.6 mole percent yttria.

4. The ESD dissipative ceramic component of claim 2, wherein the Y-TZP comprises 2.8 mole percent yttria.

5. The ESD dissipative ceramic component of claim 2, wherein the Y-TZP comprises 3 mole percent yttria.

6. The ESD dissipative ceramic component of claim 1, wherein the resistivity modifier comprises from about 10 vol. % to 50 vol. % of the base material.

7. The ESD dissipative ceramic component of claim 1, wherein the resistivity modifier comprises from about 20 vol. % to 40 vol. % of the base material.

8. The ESD dissipative ceramic component of claim 1, wherein the resistivity modifier comprises from about 25 vol. % to 30 vol. % of the base material.

9. The ESD dissipative ceramic component of claim 1, wherein the resistivity modifiers is selected from the group consisting of oxides, carbides, nitrides, oxycarbides, oxynitrides, and oxycarbonitrides.

10. The ESD dissipative ceramic component of claim 1, wherein the flexural strength is at least 600 MPa.

11. The ESD dissipative ceramic component of claim 1, wherein the flexural strength is at least 700 MPa.

12. The ESD dissipative ceramic component of claim 1, wherein the flexural strength is at least 800 MPa.

13. The ESD dissipative ceramic component of claim 1, wherein the flexural strength is at least 900 MPa.

14. The ESD dissipative ceramic component of claim 1, wherein the flexural strength is at least 1000 MPa.

15. The ESD dissipative component of claim 1, where the component has less than 600 particles/cm$^2$ in the particle generation test and where the component has an Ra of less than 3000 Å.

16. The ESD dissipative component of claim 15, wherein the surface finish is produced by tumbling.

17. The ESD dissipative component of claim 15, wherein the color of the ceramic is light.

18. The ESD dissipative component of claim 15, wherein the color of the ceramic is dark.

19. An ESD dissipative ceramic component formed by sintering a mixture comprising a base material and one or more resistivity modifiers for a sufficient time and at a sufficient temperature to achieve at least 99.5 percent of the theoretical density;
   wherein the base material comprises a tetragonal zirconia polycrystal (TZP);
   wherein the resistivity modifier comprises from about 5 vol. % to 60 vol. % of the base material and is selected from the group consisting of conductive and semiconductive materials or mixtures thereof;
   and wherein the ESD dissipative ceramic component has the following physical properties:
      (a) volume resistivity ranging from $10^5$–$10^9$ Ohm-cm;
      (b) flexural strength of at least 500 MPa; and
      (c) voltage decay time of less than 500 ms.

20. The ESD dissipative ceramic component of claim 19, wherein the TZP comprises yttria stabilized TZP (Y-TZP) wherein the yttria is present at from about 2.5 to 4.5 mole percent.

21. The ESD dissipative ceramic component of claim 20, wherein the Y-TZP comprises 2.6 mole percent yttria.

22. The ESD dissipative ceramic component of claim 20, wherein the Y-TZP comprises 2.8 mole percent yttria.

23. The ESD dissipative ceramic component of claim 20, wherein the Y-TZP comprises 3 mole percent yttria.

24. The ESD dissipative ceramic component of claim 19, wherein the resistivity modifier comprises from about 10 vol. % to 50 vol. % of the base material.

25. The ESD dissipative ceramic component of claim 19, wherein the resistivity modifier comprises from about 20 vol. % to 40 vol. % of the base material.

26. The ESD dissipative ceramic component of claim 19, wherein the resistivity modifier comprises from about 25 vol. % to 30 vol. % of the base material.

27. The ESD dissipative ceramic component of claim 19, wherein the resistivity modifiers is selected from the group consisting of oxides, carbides, nitrides, oxycarbides, oxynitrides, and oxycarbonitrides.

28. The ESD dissipative ceramic component of claim 19, wherein the flexural strength is at least 600 MPa.

29. The ESD dissipative ceramic component of claim 19, wherein the flexural strength is at least 700 MPa.

30. The ESD dissipative ceramic component of claim 19, wherein the flexural strength is at least 800 MPa.

31. The ESD dissipative ceramic component of claim 19, wherein the flexural strength is at least 900 MPa.

32. The ESD dissipative ceramic component of claim 19, wherein the flexural strength is at least 1000 MPa.

33. The ESD dissipative component of claim 19, where the component has less than 600 particles/cm$^2$ in the particle generation test and where the component has an Ra of less than 3000 Å.

34. The ESD dissipative component of claim 33, wherein the surface finish is produced by tumbling.

35. The ESD dissipative component of claim 33, wherein the color of the ceramic is light.

36. The ESD dissipative component of claim 33, wherein the color of the ceramic is dark.

37. An ESD dissipative ceramic component comprising from about 85 to 60 vol. % Y-TZP and from about 15 to 40 vol. % ZnO densified to at least 99% of the theoretical density by primary and secondary heat treatments.

38. The ESD dissipative ceramic component of claim 37, wherein the composition has an L* color measurement of at least 50 using the CIE 1976 L*a*b scale on an LKE colorimeter.

39. An ESD dissipative ceramic component formed of a sintered composition comprising:
   a base material comprising tetragonal zirconia; and
   a resistivity modifier comprising about 5 vol % to about 60 vol % of the base material, the resistivity modifier selected from conductive and semiconductive materials and mixtures thereof, wherein
      the ESD dissipative ceramic component has a density of at least 99% of the theoretical density of the component.

40. The ESD dissipative ceramic component of claim 39, wherein said Y-TZP is present in an amount of about 90 to 50 vol. %, and said resistivity modifier comprises from about 10 to 50 vol. % semi-conductive $SnO_2$.

41. The ESD dissipative ceramic component of claim 40, wherein the composition has an L* color measurement of at least 50 using the CIE 1976 L*a*b* scale on an LKE colorimeter.

42. The ESD dissipative ceramic component of claim 39, wherein said Y-TZP is present in an amount of about 80 to 70 vol. %, and said resistivity modifier comprises about 20 to 30 vol. % $LaMnO_3$.

43. The ESD dissipative ceramic component of claim 39, wherein said Y-TZP is present in an amount of about 90 to 60 vol. % Y-TZP, and said resistivity modifier comprises about 10 to 40 vol. % $LaCrO_3$.

44. The ESD dissipative ceramic component of claim 39, wherein said Y-TZP is present in an amount of about 90 to 75 vol. %, and said resistivity modifier comprises about 10 to 25 vol. % ZrC.

45. The ESD dissipative ceramic component claim 39, wherein said Y-TZP is present in an amount of about 75 vol. % and, and said resistivity modifier comprises about 25 vol. % $BaO\ 6Fe_2O_3$.

46. The ESD dissipative ceramic component of claim 39, wherein the resistivity modifier comprises and semiconductive $SnO_2$, said ceramic component having the following physical characteristics:
   (a) predetermined decay time; and
   (b) hardness greater than 10 GPa Vickers.

47. The ESD dissipative ceramic component of claim 46, wherein the $SnO_2$ is present in the range of 20–80% by vol of the initial reagents.

48. The ESD dissipative component, of claim 39, wherein the component is selected from the group consisting of MR (magnetoresistive) head substrates, transfer tools for magnetic head manufacturing, tools, fixtures, and containers for HGA (head gimbal assembly), HSA (head stack assembly), HDD (hard disk drive) assembly, tools, fixtures, and containers for wafer handling, processing, and cleaning, tools, fixtures, and containers for wire bonding, trimming, cutting, pick-and-place nozzles for IC chip handling, nozzles for adhesive and solder dispensing, wafer handling fixtures, end effectors, vacuum chucks, IC handling and test fixtures, tools, fixtures, and containers for ESD sensitive devices, assembly fixtures for IC's and magnetic heads, tweezers, screw drivers, scissors, blades, parts for robotic fingers, tools, fixtures, and containers for electro-optic coating process, tools, fixtures, and containers for reticles (photo mask).

49. An ESD dissipative ceramic component formed by sintering a mixture comprising a base material and one or more resistivity modifiers;
   wherein the base material comprises a tetragonal zirconia polycrystal (TZP);
   wherein the resistivity modifier comprises from about 5 vol. % to 60 vol. % of the base material and is selected from the group consisting of conductive and semiconductive materials or mixtures thereof;
   and wherein the ESD dissipative ceramic component has the following physical properties:
      (a) volume resistivity ranging from $10^6$–$10^9$ Ohm-cm;
      (b) flexural strength of at least 400 MPa; and
      (c) voltage decay time of less than 500 ms.

50. The ESD dissipative ceramic component of claim 49, wherein the sintering is conducted in air.

51. The ESD dissipative ceramic component of claim 50, wherein a secondary heat treatment step comprises hot isostatic pressing.

52. The ESD dissipative ceramic component of claim 49, wherein the resistivity modifier is selected from the group consisting of ZnO, $SnO_2$, ZrC, $LaMnO_3$, $BaO\ 6Fe_2O_3$.

53. An ESD dissipative ceramic component formed of a sintered composition comprising:
   a base material comprising tetragonal zirconia; and
   a resistivity modifier comprising about 5 vol % to about 60 vol % of the base material, the resistivity modifier selected from conductive and semiconductive materials and mixtures thereof, wherein the ESD dissipative ceramic component has an L* color measurement of at least 50 using the CIE 1976 L*a*b* scale on an LKE calorimeter, a density not less than 95% of theoretical density, and a volume resistivity within a range of about $10^3$ to about $10^{11}$.

54. The ESD dissipative ceramic component of claim 53, wherein the ESD dissipative ceramic component has the following physical properties:

(a) volume resistivity ranging from $10^5$–$10^9$ Ohm-cm;

(b) flexural strength of at least 400 MPa; and (c) a residual flux density no greater than about 10 Gauss.

55. The nonmagnetic ESD dissipative ceramic component of claim 54, wherein the resistivity modifiers have a molar magnetic susceptibility of less than $10^{-3}$ ml/mol.

56. The nonmagnetic ESD dissipative ceramic component of claim 55, wherein the resistivity modifiers are selected from the group consisting of ZnO, $SnO_2$, $LaMnO_3$, BaO $6Fe_2O_3$ and mixtures thereof.

57. The ESD dissipative ceramic component of claim 53, wherein the component is a transfer tool for magnetoresistive head manufacturing, wherein the ESD dissipative ceramic transfer tool has a residual flux density no greater than about 10 Gauss.

58. A method of processing a wafer, comprising:

providing a tool for processing the wafer, the tool comprising the sintered composition of claim 53; and processing the wafer utilizing the tool.

59. The component of claim 53, wherein said resistivity modifier comprises at least one of ZnO and $SnO_2$.

60. The component of claim 53, wherein the density is not less than about 98% of theoretical density.

61. The component of claim 53, wherein the density is not less than about 99% of theoretical density.

62. An ESD dissipative ceramic component formed of a sintered composition comprising:

a base material comprising tetragonal zirconia; and a resistivity modifier comprising about 5 vol % to about 60 vol % of the base material, the resistivity modifier selected from conductive and semiconductive materials and mixtures thereof, wherein the component has less than 600 particles/$cm^2$ in a particle generation test.

63. A method of processing a wafer, comprising:

providing a tool for processing the wafer, the tool comprising the sintered composition of claim 62; and processing the wafer utilizing the tool.

64. The component of claim 62, wherein the particle generation test is carried out by subjecting the component to an ultrasonic bath to dislodge particles into water, at a frequency of 68 kHz for 30 seconds.

65. An ESD dissipative ceramic integrated circuit fixture formed of a sintered composition comprising:

a base material comprising tetragonal zirconia; and a resistivity modifier comprising about 5 vol % to about 60 vol % of the base material, the resistivity modifier selected from conductive and semiconductive materials and mixtures thereof, wherein the fixture has a density of at least 99% of the theoretical density.

66. The fixture of claim 65, wherein the fixture is selected from the group consisting of handling, test, and assembly fixtures for integrated circuits.

67. The fixture of claim 65, wherein the fixture is a test fixture for integrated circuits.

68. An ESD dissipative ceramic integrated circuit fixture formed of a sintered composition comprising:

a base material comprising tetragonal zirconia; and a resistivity modifier comprising about 5 vol % to about 60 vol % of the base material, the resistivity modifier selected from conductive and semiconductive materials and mixtures thereof, wherein the fixture has less than 600 particles/$cm^2$ in a particle generation test.

69. The fixture of claim 68, wherein the fixture is selected from the group consisting of handling, test, and assembly fixtures for integrated circuits.

70. The fixture of claim 68, wherein the fixture is a test fixture for integrated circuits.

* * * * *